US005283208A

United States Patent [19]
Lorsung et al.

[11] Patent Number: 5,283,208
[45] Date of Patent: Feb. 1, 1994

[54] METHOD OF MAKING A SUBMICROMETER LOCAL STRUCTURE USING AN ORGANIC MANDREL

[75] Inventors: Michael J. Lorsung, Rochester; Connie J. Mathison, Pine Island, both of Minn.

[73] Assignee: International Business Machines Corporation, Armonk, N.Y.

[21] Appl. No.: 985,709

[22] Filed: Dec. 4, 1992

[51] Int. Cl.5 .......................................... H01L 21/465
[52] U.S. Cl. .................................. 437/228; 437/189; 437/195
[58] Field of Search ............. 437/189, 195, 948, 228; 148/DIG. 104, DIG. 106

[56] References Cited

U.S. PATENT DOCUMENTS

| | | | |
|---|---|---|---|
| 3,911,562 | 10/1975 | Youmans | 29/590 |
| 4,702,792 | 10/1987 | Chow et al. | 156/645 |
| 4,776,922 | 10/1988 | Bhattacharyya et al. | 156/643 |
| 4,799,990 | 1/1989 | Kerbaugh et al. | 156/636 |
| 4,801,350 | 1/1989 | Mattox et al. | 156/643 |
| 4,838,991 | 6/1989 | Cote et al. | 156/643 |
| 4,981,550 | 1/1991 | Huttemann et al. | 156/643 |
| 4,997,746 | 3/1991 | Greco et al. | 437/229 |
| 5,173,442 | 12/1992 | Carey | 437/173 |

OTHER PUBLICATIONS

IBM Technical Disclosure Bulletin, J. P. Gambino et al., "Deep-Submicron Tungsten-Polysilicon Inverse-T Gate" vol. 34, No. 2, Jul. 1991.

Primary Examiner—Olik Chaudhuri
Assistant Examiner—H. Jey Tsai
Attorney, Agent, or Firm—Susan L. Firestone; Andrew J. Dillon

[57] ABSTRACT

The invention relates to a method of making a local structure from an organic mandrel on a substrate at the submicrometer level. The mandrel is formed from an organic layer deposited on the substrate. The mandrel is then removed by exposure to an oxygen plasma environment, thus leaving a cavity. A local structure material is deposited into the cavity and polished to form the local structure. In the preferred method of the invention, an electrically conducting, local interconnect is formed from a polyimide mandrel on a wafer used to make integrated circuits.

15 Claims, 4 Drawing Sheets

METHOD OF MAKING A SUBMICROMETER LOCAL STRUCTURE USING AN ORGANIC MANDREL

BACKGROUND OF THE INVENTION

1. Technical Field

The invention relates a method of making a local structure from an organic mandrel on a substrate at submicrometer dimensions.

2. Description of the Related Art

Over the past few years, the size of the integrated circuit has diminished substantially to submicrometer dimensions. As the size decreases, the challenge of making these small circuits increases. Manufacturing integrated circuits with specialized local structures, like local electrically conducting interconnects, is demanding at these submicrometer dimensions. Making these submicrometer structures is often difficult and time consuming, requiring the layering of different levels of films. Further, it has been difficult to make submicrometer structures in additional layers of film.

The prior art describes different methods for forming local submicrometer structures. Some methods rely on lithography alone to form these structures. Other methods use mandrels, or blocks of material with substantially vertical sidewalls. Several mandrel methods employ side wall image transfer processes to define an image below the side wall after removing the mandrel. For example, U.S. Pat. No. 4,838,991, assigned to the assignee of the current invention, discloses a method of defining the sidewall structures on the mandrel. In this method the mandrel is anisotropically etched to remove the horizontal surfaces, thereby leaving the mandrel's vertical sidewalls.

The prior art of fabricating local structures, such as electrical interconnects for submicrometer CMOS processor technology, is complex, expensive and requires specialized equipment. Fabrication uses many steps of depositing, etching and modifying the various films deposited on the integrated circuit. These steps often need specialized etchers and oxidation tubes and are difficult to use over multiple underlying films.

One object of the invention is to provide a simple way to define a local structure such as an electrical interconnect over multiple underlying films.

Another object of the invention is to add additional layers of film containing local structures at the submicrometer level.

SUMMARY OF THE INVENTION

The invention relates to a method of making a local structure formed from a mandrel on a substrate at submicrometer dimensions. An organic layer is first deposited on the substrate, which is then cured. A first layer of glass is applied over the organic layer. The location of the mandrel is defined on the glass prior to using a reactive ion etch. The next step, forms the mandrel from the organic layer by exposing the organic layer to a first oxygen plasma environment. After forming the mandrel, a second layer of glass is deposited on the substrate and polished to expose the mandrel. A second exposure to an oxygen plasma environment removes the mandrel, thereby leaving a cavity. At least one layer of a local structure material is applied to the substrate to at least partially fill the cavity. Finally, at least one layer of the structural substance is polished, thus defining the local structure.

In the preferred method of the invention, the local structure is an electrically conducting, local interconnect on an integrated circuit. The local interconnect is made on a wafer. A layer of polyimide is applied using liquid dispense and spin apply. After polyimide dispense, the polyimide is cured under nitrogen at 410C and a layer of tetraethylorthosiline silicon dioxide is low temperature, plasma enhanced, chemical vapor deposited over the polyimide layer. The glass layer is defined with the location of the mandrel using photolithography. The glass layer is etched using a reactive ion plasma, silicon oxide etching chemistry. Next the polyimide is etched using a reactive ion oxygen plasma which removes the unprotected polyimide to form the mandrel. A second layer of tetraethylorthosiline silicon dioxide is low temperature, plasma enhanced, chemical vapor deposited on the wafer. The wafer is then chemically-mechanically polished to expose the mandrel. After exposing the mandrel, the wafer is treated with a second oxygen plasma using a downstream mode to remove the polyimide and leave a cavity. A layer of tungsten is plasma enhanced, chemical vapor deposited on the wafer in order to fill the cavity. Chemical-mechanical polishing finishes the formation of the local interconnect. These steps may be repeated to form local structures in additional film layers, if desired.

BRIEF DESCRIPTION OF THE DRAWINGS

The novel features believed characteristic of the invention are set forth in the appended claims. The invention itself, however, as well as a preferred mode of use, further objects and advantages thereof, will best be understood by reference to the following detailed description of an illustrative embodiment when read in conjunction with the accompanying drawings, wherein:

DETAILED DESCRIPTION OF THE INVENTION

Figure 1:
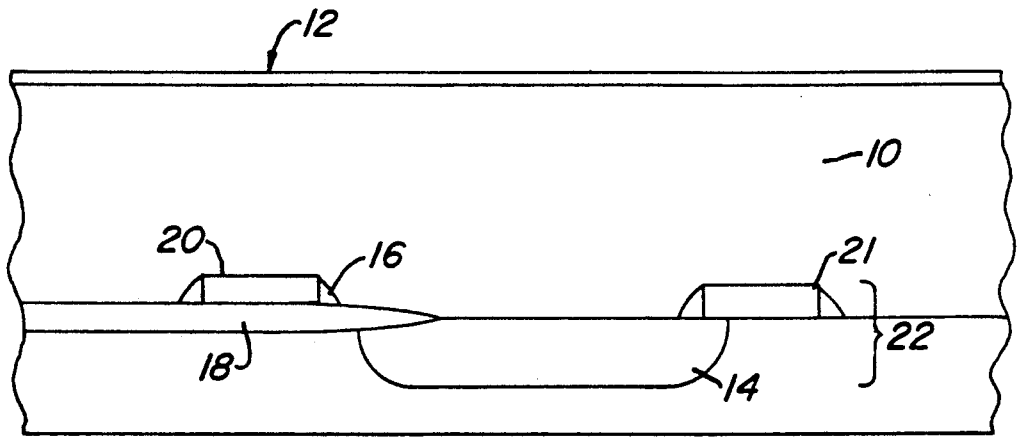
FIG. 1 is a cross sectional view of a substrate after the deposition of glass according to one of the steps of the invention.

The invention describes a method of making a submicrometer local structure from a mandrel on a substrate. The method first forms a mandrel out of an organic substance, then the local structure is made from the mandrel. This local structure is preferably a local interconnect which is often found on the first intermediate level of an integrated circuit. The local interconnect preferably conducts electrical current on an integrated circuit.

In the method of the invention, an organic layer is deposited onto a substrate. This deposition uses techniques commonly known in the art, preferably by coating the substrate with an organic substance and subsequently curing it. The substrate is preferably a wafer which may have other films or regions already present on it, such as doping regions; diffusion regions; polysilicon; spacers; isolation oxides, such as isolation thermal silicon dioxide; sources; drains; passivants; and the like. The organic substance can be any organic substance that is volatile in an oxygen plasma environment and neither changes nor decomposes in other processing steps. Suitable organic substances include various organic polymers, for instance, the resins and polyimides that are commonly used in the electronics industry. Most preferably, the organic polymer is a polyimide applied using liquid dispense and spin apply. This leaves the top of the polyimide virtually planar in a wafer which may have other layers of underlying films or regions.

If desired, the organic layer is planarized to remove oxides present on the surface, preferably by chemical-mechanical polishing which is a common technique known to those skilled in the art. One example of chemical-mechanical polishing is found in U.S. Pat. No. 4,671,851, assigned to the assignee of the present invention. Briefly, a slurry of an abrasive in an alkaline solution is applied to the organic layer with a pad. Planarizing opens and smooths the surface to enhance subsequent etching steps.

The next step cures the organic layer. In this disclosure, the term "cure" refers to decreasing the amount of volatile compounds contaminating the organic layer, both internally and on the surface. This step reduces blistering of the organic layer during subsequent processing steps. Preferably, the substrate cures in an oven under nitrogen at 410° C.

The organic layer next has a first layer of glass applied to it, preferably by coating or capping with a low temperature, plasma enhanced, chemical vapor of glass. Any glass can be used so long as it does not degrade the organic layer, and during subsequent processing steps, especially the polishing steps, the glass itself neither degrades, cracks nor softens. Preferably, the selected glass seals the organic layer with a layer of oxides, therefore silicon dioxide and its compounds are desired. Most preferably, the glass is tetraethylorthosiline silicon dioxide.

The location of the mandrel must be defined on the first glass layer prior to mandrel formation. Preferably, the glass is etched to define the mandrel's location. A predetermined design of etching resistant material having exposed areas and resist areas is applied to the glass layer. This design defines the mandrel's location. Dry etching of the glass is preferred. The etch resistant material definition can be accomplished by using standard lithography techniques, most preferably, photolithography. These techniques are well known in integrated circuit manufacturing. The type of resist does not matter. However during photolithography, positive or negative resists must be used to properly define the mandrel image. Preferably, the entire substrate is exposed during etching.

Next, the first layer of the glass is etched with a reactive ion etch to further define the location of the mandrel. Preferably, the glass is etched using a reactive ion etch that is well known to those skilled in the art. This step can use any plasma that can anisotropically etch glass and either stops at the organic layer or shortly after entering the organic layer.

Exposure to a first oxygen plasma environment forms the mandrel by removing the organic layer not protected by the remaining glass. This step should also remove any etching resistant material present. The conditions of this step are well known in the art. Although many techniques work well, low pressure plasma used in a reactive ion etch mode is currently preferred.

A second layer of glass is deposited on the substrate. This layer of glass has properties similar to the first glass layer. Therefore, the second layer of glass can be deposited in the same manner as the first layer of glass. Next, chemical-mechanical polishing of the substrate to the organic layer reveals the mandrel.

A second exposure to an oxygen plasma environment removes the remaining organic substance, thus removing the mandrel and leaving a cavity. Again, many techniques may work, but here the use of an oxygen plasma in a downstream mode is currently preferred.

At least one layer of local structure material is applied to the substrate and polished to fashion the local structure. Therefore, this step should at least partially fill the cavity left behind by removing the mandrel. Plasma enhanced, chemical vapor deposition is the preferred method to apply the local structure material. Preferably, one layer is applied in sufficient quantities to fill the cavity. Chemical-mechanical polishing is the preferred method of polishing.

For making electrically conducting interconnects, any electrical conductor can be used that can be chemically-mechanically polished and does not introduce traps under the conditions selected for practicing the invention. A partial list of potential conductors are: tungsten, aluminum, titanium, tantalum, niobium, hafnium, copper, platinum, polysilicon, titanium nitride and silicon nitride. Tungsten is most preferred.

The method of the invention can be repeated numerous times to form multiple layers of films with local structures at the submicrometer level. Each local structure can be of either the same or different material. For example, if the first local structure material is tungsten, the second local structure material can be another electrically conducting material, such as copper.

In another embodiment of the invention, a nitride layer can be deposited on the substrate before applying the organic substance. The nitride is chemical vapor deposited under either low pressure or plasma enhanced conditions. The nitride must be a material that does not etch any layers to which it is exposed nor degrade the device performance. Silicon nitride is preferred. The nitride protects the underlying structures on the substrate and can serve as a passivant. After the mandrel is removed, the nitride layer is etched by either wet or dry processes. Preferably, a reactive ion etch capable of etching nitride is used.

An optional nitride layer can also be deposited after forming the local structure. This nitride layer must be deposited using a plasma enhanced, chemical vapor deposition. The nitride layer can be etched, if desired, in the manner described above for etching the nitride layer after the mandrel is removed.

In another embodiment of the invention, a second local structure is added after fashioning a first local structure. To make the second local structure, a third layer of glass is deposited on the substrate in a manner similar to the deposition of the first layer of glass. The location of the second local structure is defined in a manner similar to defining the location of the mandrel. The location of the second local structure is next etched in a reactive ion etch. Then, at least one layer of a second local structure material is deposited and polished. This layer is applied and polished under similar conditions as the first local structure material. The circuit is ready for additional processing, such as making additional local interconnects from an organic mandrel or metal sputtering.

Referring now to the Figures, each Figure is a cross sectional view representing an area of the substrate while practicing one embodiment of the invention. Directional terms are used only to increase understanding and not to imply any specific orientation. FIG. 1 views the substrate 22 after adding the first layer of glass 12. A polyimide layer 10 lies on substrate 22 after liquid dispense. This substrate 22 includes several different regions, such as a spacer 16, an isolation oxide 18, polysilicon regions 20, 21 and a diffusion region 14. A layer of glass 12 lies above the polyimide layer.

Figure 2:
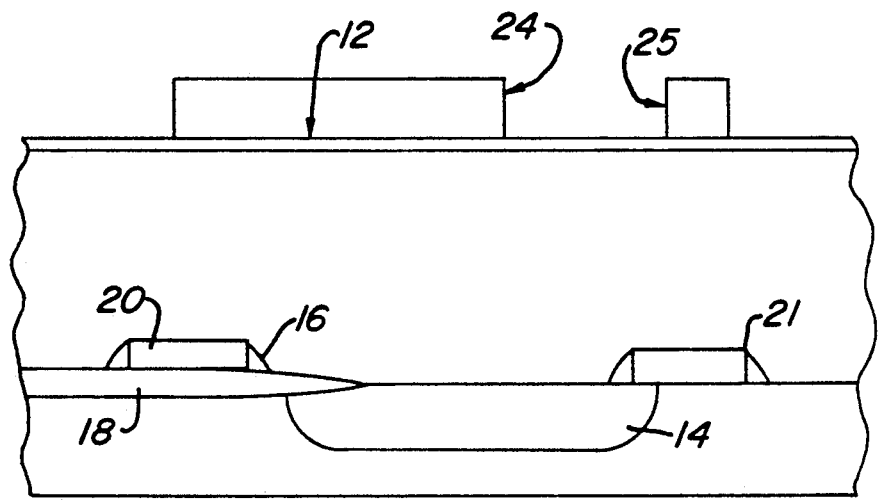
FIG. 2 is a cross sectional view of a substrate after defining the position of the mandrel location according to one of the embodiments of the invention.
Figure 3:
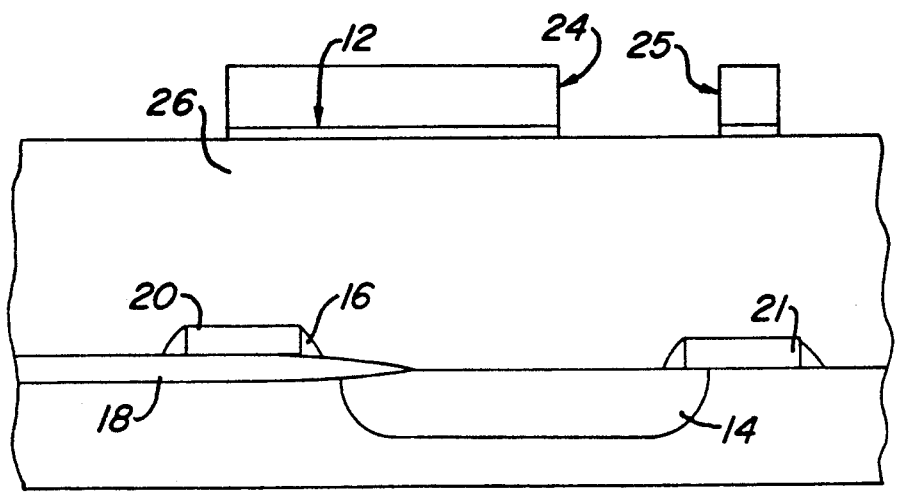
FIG. 3 is a cross sectional view of a substrate after a plasma reactive ion etch according to one of the embodiments of the invention.
Figure 4:
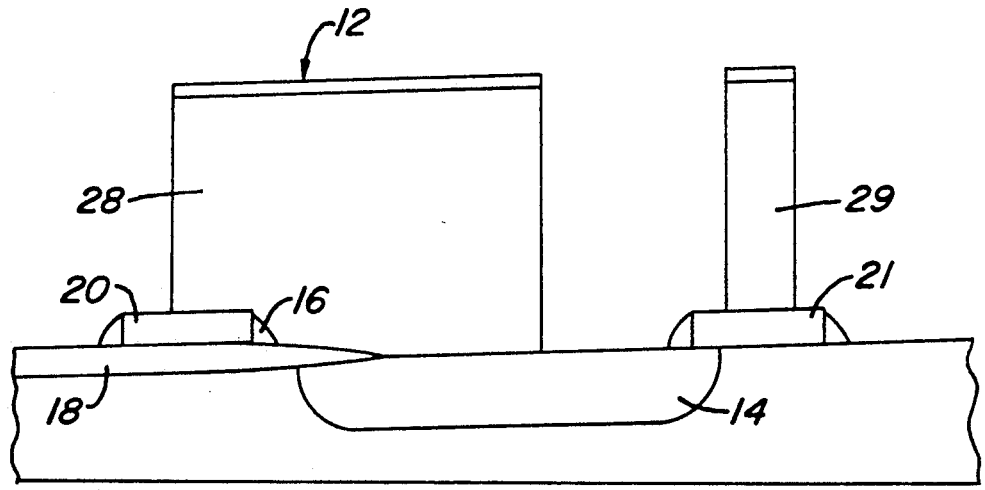
FIG. 4 is a cross sectional view of a substrate after defining the mandrels according to one of the embodiments of the invention.
Figure 5:
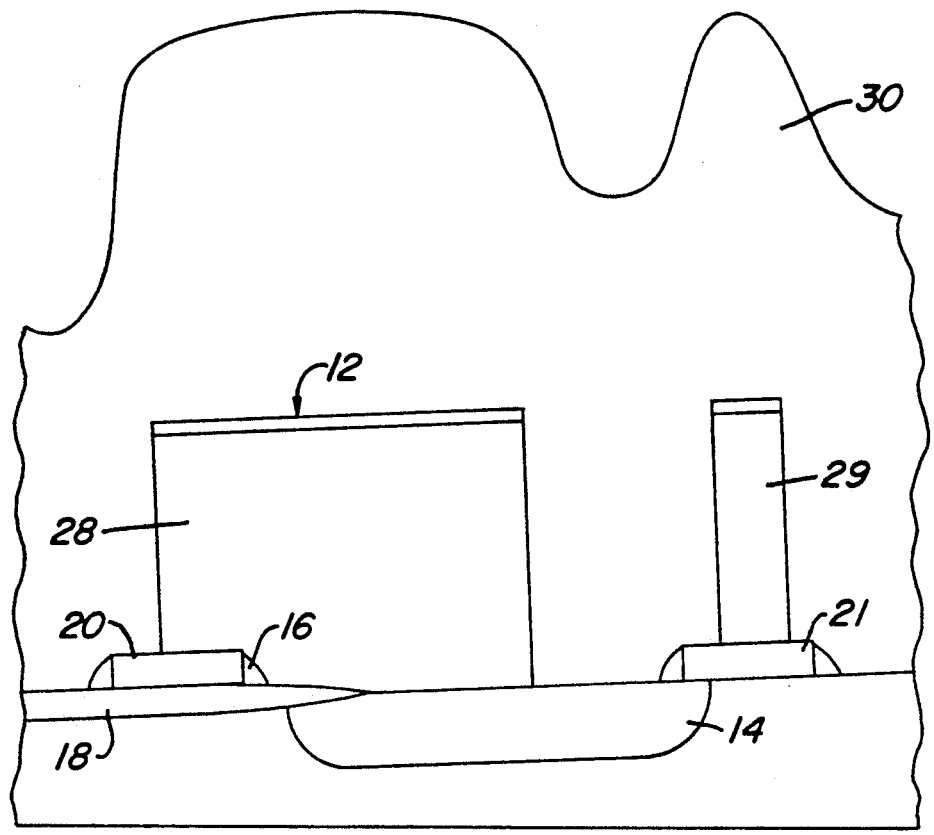
FIG. 5 is a cross sectional view of a substrate after depositing a second layer of glass according to one of the embodiments of the invention.
Figure 6:
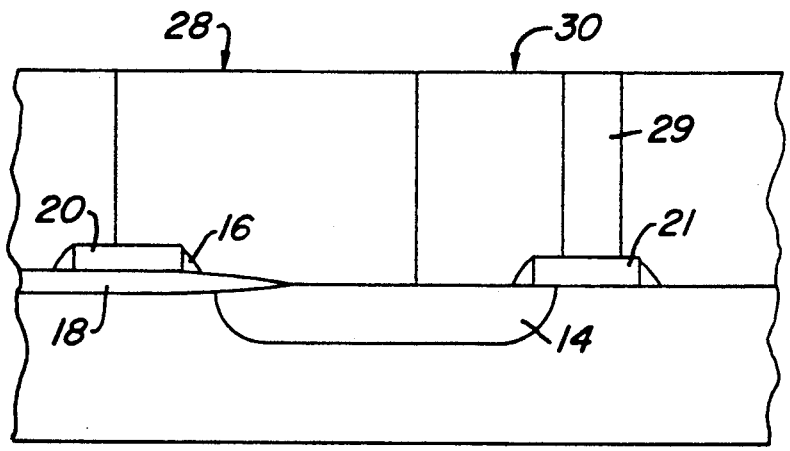
FIG. 6 is a cross sectional view of a substrate after the polishing step the wafer according to one of the embodiments of the invention.
Figure 7:
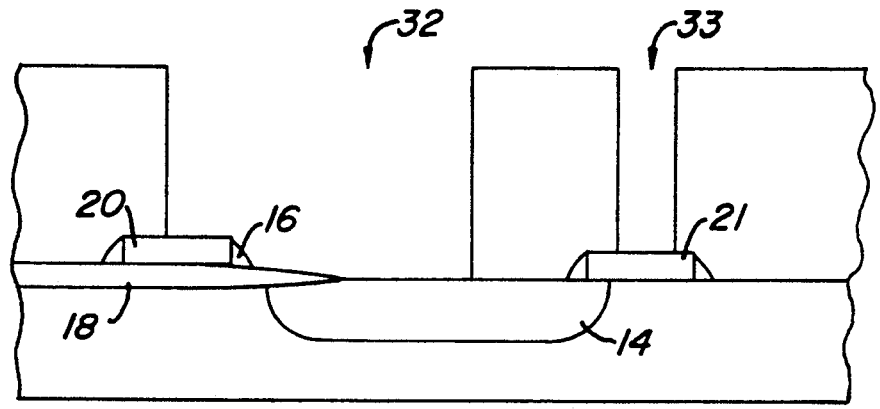
FIG. 7 is a cross sectional view of a substrate after forming the cavity according to one of the embodiments of the invention.
Figure 8:
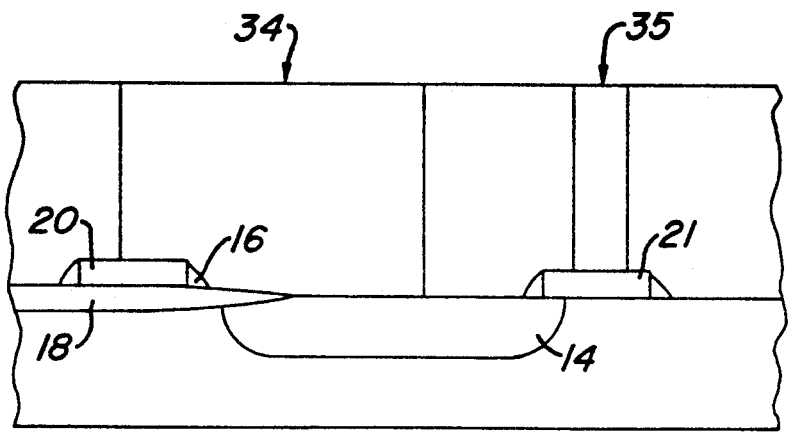
FIG. 8 is a cross sectional view of a substrate after forming an electrically conducting interconnect according to one of the embodiments of the invention.

The rest of the processing steps of this embodiment are described in FIGS. 2-8. FIG. 2 demonstrates the initial definition of the mandrel. A layer of resist material 24 applied to the glass, protects the glass 12 during photolithography. In this embodiment, the areas under the resist material 24, 25 are the mandrel locations. A reactive ion etch removes the glass unprotected by the resist material 24, 25, further defining the mandrel location 26 as shown in FIG. 3. An oxygen plasma defines the polyimide mandrels 28, 29 and removes the resist material as demonstrated by FIG. 4. After adding a second layer of glass 30 as shown in FIG. 5, the glass layers 12, 30 undergo chemical-mechanical polishing. This step exposes the polyimide mandrels 28, 29 by removing the first layer of glass 12 and polishing the second layer of glass 30 until the tops of the mandrels 28, 29 are exposed as in FIG. 6. The exposure of the mandrels does not require the surface be flush with the top but can allow for a chemical-mechanical over polish (process latitude). FIG. 7 exhibits the cavities 32, 33 produced after removing the mandrels. In FIG. 8, local interconnects 34, 35 form after the chemical vapor deposition of tungsten and subsequent chemical-mechanical polishing.

Figure 9:
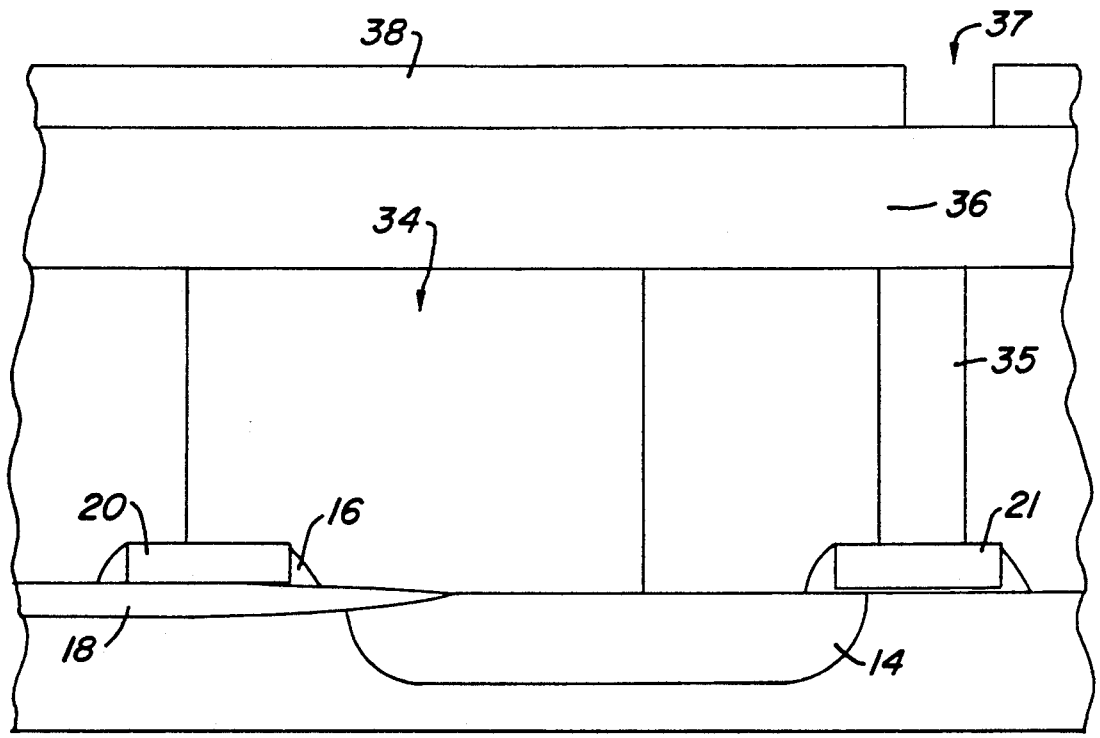
FIG. 9 is a cross sectional view of a substrate after photolithographic definition of a contact according to one of the embodiments of the invention.
Figure 10:
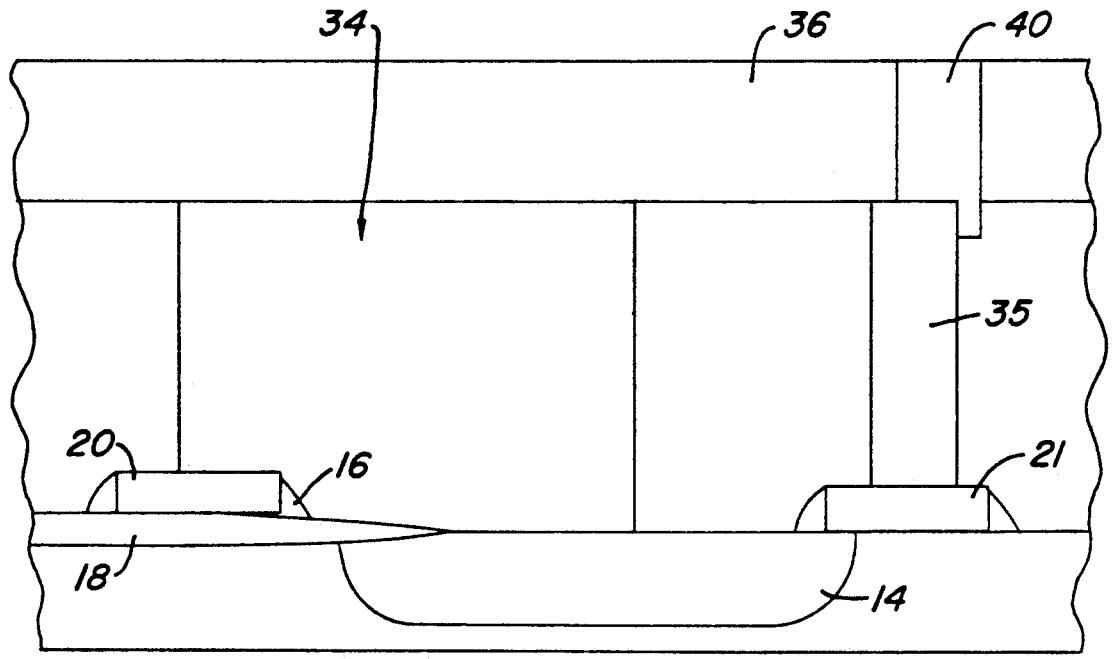
FIG. 10 is a cross sectional view of a substrate after forming a contact according to one of the embodiments of the invention.

FIGS. 9 and 10 demonstrate how a second local structure, such as a contact, can be added. In FIG. 9, a layer of a photoresist material 38 defines the location of the contact 37 on a third layer of glass 36. FIG. 10 shows contact 40 made after first etching the glass from the location of the contact, then depositing and polishing tungsten. Note that local interconnect 34 is buried.

At this point, the integrated circuit is ready for further processing, such as metal sputtering.

The method of the invention provides a unique and simple way to define a local structure such as an electrical interconnect over multiple underlying films. Multiple films challenge conventional definition techniques used to define structures at the submicrometer level. The current method has the ability to repeat the steps any number of times to form the same or different types of local structures. For example, making electrically conducting interconnects of tungsten and copper at different levels of film. The local structure can be buried by subsequent films.

While the invention has been particularly shown and described with reference to a preferred embodiment, it will be understood by those skilled in the art that various changes in form and detail may be made therein without departing from the spirit and scope of the invention.

What is claimed is:

1. A method of making a local structure from a mandrel on a substrate at submicrometer dimensions, the method comprising the steps of:
   a. providing the substrate;
   b. depositing an organic layer on the substrate;
   c. curing the organic layer;
   d. applying a first layer of glass in order to at least partially coat the organic layer;
   e. defining the location of the mandrel;
   f. etching the first layer of glass by using a reactive ion etch;
   g. forming the mandrel by etching in a first oxygen plasma environment after etching the first layer of glass with the reactive ion etch;
   h. depositing a second layer of glass after forming the mandrel;
   i. exposing the mandrel by polishing the second layer of glass;
   j. removing the mandrel by exposure to a second oxygen plasma environment in order to leave a cavity;
   k. applying at least one layer of a local structure material in order to at least partially fill the cavity, the local structure material being of a type used to make the local structure at submicrometer dimensions and can be polished; and
   l. polishing at least one layer of the local structure material in order to define the local structure.

2. A method of making a local structure from a mandrel on a substrate at submicrometer dimensions, the method comprising the steps of:
   a. providing the substrate;
   b. depositing an organic layer on the substrate;
   c. curing the organic layer;
   d. applying a first layer of glass in order to at least partially coat the organic layer;
   e. applying a predetermined design of an etching resistant material over the first layer of glass, the predetermined design of the etching resistant material having exposed areas and resist areas in order to define the location of the mandrel;
   f. defining the location of the mandrel by etching the exposed areas of the predetermined design of the etching resistant material;
   g. etching the first layer of glass by using a reactive ion etch;
   h. forming the mandrel by etching in a first oxygen plasma environment after etching the first layer of glass with the first reactive ion etch;
i. depositing a second layer of glass after forming the mandrel;
j. exposing the mandrel by polishing the second layer of glass;
k. removing the mandrel by exposure to a second oxygen plasma environment in order to leave a cavity;
l. applying at least one layer of a local structure material in order to at least partially fill the cavity, the local structure material being of a type used to make the local structure at submicrometer dimensions and can be polished; and
m. polishing at least one layer of the local structure material in order to define the local structure.

3. The method of claim 2, wherein the organic layer is formed from an organic substance selected from the group consisting of polyimide and resin.

4. The method of claim 2, wherein the glass is an oxide.

5. The method of claim 4, wherein the glass is selected from the group consisting of silicon dioxide and tetraethylorthosiline silicon dioxide.

6. The method of claim 2, wherein the local structure material is an electrically conducting material.

7. The method of claim 6, wherein the local structure material is selected from the group consisting of:
aluminum, copper, hafnium, niobium, platinum, polysilicon, silicon nitride, tantalum, titanium, titanium nitride, and tungsten.

8. The method of claim 2, the method further comprising the steps of:
n. depositing a layer of nitride on the substrate prior to step b; and
o. etching the layer of nitride after step k and prior to step 1.

9. The method of claim 2, the method further comprising the steps of:
n. depositing a layer of nitride on the substrate after step m; and
o. etching the layer of nitride.

10. A method of making a local structure from a mandrel on a substrate at submicrometer dimensions, the method comprising the steps of:
a. providing the substrate;
b. dispensing a polyimide layer on the substrate;
c. curing the organic layer;
d. applying a first layer of glass in order to at least partially coat the organic layer;
e. applying a predetermined design of an etching resistant material over the first layer of glass, the predetermined design of the etching resistant material having exposed areas and resist areas in order to define the location of the mandrel;
f. defining the location of the mandrel by etching at the exposed areas of the predetermined design of the etching resistant material;
g. etching the first layer of glass by using a reactive ion etch;
h. forming the mandrel by etching in a first oxygen plasma environment after etching the first layer of glass with the first reactive ion etch;
i. depositing a second layer of glass after forming the mandrel;
j. exposing the mandrel by polishing the second layer of glass;
k. removing the mandrel by exposure to a second oxygen plasma environment in order to leave a cavity;
l. applying at least one layer of an electrical conductor selected from the group consisting of: aluminum, copper, hafnium, niobium, platinum, polysilicon, silicon nitride, tantalum, titanium, titanium nitride, and tungsten, in order to at least partially fill the cavity; and
m. polishing at least one layer of the electrical conductor in order to define the local structure.

11. A method of making a local structure from a mandrel on a substrate at submicrometer dimensions, the method comprising the steps of:
a. providing the substrate;
b. depositing an organic layer on the substrate;
c. curing the organic layer;
d. applying a first layer of glass in order to at least partially coat the organic layer;
e. applying a predetermined design of an etching resistant material over the first layer of glass, the predetermined design of the etching resistant material having exposed areas and resist areas in order to define the location of the mandrel;
f. defining the location of the mandrel by etching the exposed areas of the predetermined design of the etching resistant material;
g. etching the first layer of glass by using a first reactive ion etch;
h. forming the mandrel by etching in a first oxygen plasma environment after etching the first layer of glass with the first reactive ion etch;
i. depositing a second layer of glass after forming the mandrel;
j. exposing the mandrel by polishing the second layer of glass;
k. removing the mandrel by exposure to a second oxygen plasma environment in order to leave a cavity;
l. applying at least one layer of a first local structure material in order to at least partially fill the cavity, the first local structure material being of a type used to make a first local structure at submicrometer dimensions and can be polished;
m. polishing at least one layer of the first local structure material in order to define the first local structure;
n. depositing a third layer of glass;
o. applying a predetermined design of an etching resistant material over the third layer of glass for defining exposed areas and resist areas in order to define the location of the mandrel;
p. defining the location of a second local structure by etching the exposed areas of the etching resistant material;
q. etching the location of the second local structure with a second reactive ion etch after defining the location of the second local structure;
r. applying at least one layer of a second local structure material being of a type used to make the second local structure at submicrometer dimensions and can be polished; and
s. exposing the second local structure by polishing at least one layer of the second local structure material.

12. The method of claim 11, the method further comprising the steps of:

t. depositing a layer of nitride on the substrate prior to step b; and u. etching the layer of nitride after step k and prior to step l.

13. The method of claim 11, the method further comprising the steps of:

t. depositing a layer of nitride on the substrate after step m and prior to step n; and u. etching the layer of nitride after step q and before step r.

14. The method of claim 11, wherein the first local structure material and the second local structure material are different conducting materials.

15. The method of claim 11, wherein the first local structure material and the second local structure material are the same conducting materials.

* * * * *